United States Patent [19]
Sochor

[11] Patent Number: 5,968,876
[45] Date of Patent: Oct. 19, 1999

[54] COMPRESSABLE TUNING ELEMENT FOR MICROWAVE RESONATORS AND METHOD OF MAKING SAME

[75] Inventor: Jerzy R. Sochor, Santa Cruz, Calif.

[73] Assignee: Conductus, Inc., Sunnyvale, Calif.

[21] Appl. No.: 08/837,571

[22] Filed: Apr. 21, 1997

[51] Int. Cl.[6] .............................. H01B 12/07; H03J 3/06
[52] U.S. Cl. .................. 505/210; 505/700; 505/701; 505/866; 333/99 S; 333/235
[58] Field of Search .................. 333/99 S, 235, 333/232, 233, 231; 505/210, 700, 701, 866

[56] References Cited

U.S. PATENT DOCUMENTS

| | | | |
|---|---|---|---|
| 2,666,904 | 1/1954 | Johnson | 333/233 |
| 2,742,617 | 4/1956 | Bondley | 333/233 |
| 2,829,352 | 4/1958 | Hennies et al. | 333/233 |
| 4,019,161 | 4/1977 | Kimura et al. | 333/234 |
| 4,647,883 | 3/1987 | Oxley | 333/232 X |
| 5,391,543 | 2/1995 | Higaki et al. | 505/210 |
| 5,616,538 | 4/1997 | Hey-Shipton et al. | 505/210 |

FOREIGN PATENT DOCUMENTS

| | | | |
|---|---|---|---|
| 68919 | 1/1983 | European Pat. Off. | 333/235 |
| 409319 | 8/1974 | U.S.S.R. | 333/232 |

OTHER PUBLICATIONS

*Microwave Filters, Impedance–Matching Networks, and Coupling Structures*, Matthaei, G.L., Young L., & Jones E.M.T. Artech House, Inc., pp. 668–673, 1980. (Reprint of McGraw–Hill Book Company, 1964).

Primary Examiner—Benny T. Lee
Attorney, Agent, or Firm—Merchant & Gould P.C.

[57] ABSTRACT

A tuning mechanism for tuning a resonant circuit is provided. The tuning mechanism comprises a spring pin having a superconductive, dielectric or magnetic tuning tip attached thereto. The spring pin is slidably inserted into a filter package wall through a mating hole. A mechanism is provided for adjusting the position of the tip within the electromagnetic field above the filter element. The tip may be shaped, thus allowing adjustment of both the height of the tip above the filter element and the position of the tip in a plane parallel to the plane of the filter. Optionally, the spring pin may include an offset to allow close spacing of the tips along with wider spacing of the actuator end of the pin.

20 Claims, 7 Drawing Sheets

COMPRESSABLE TUNING ELEMENT FOR MICROWAVE RESONATORS AND METHOD OF MAKING SAME

STATEMENT OF GOVERNMENT INTEREST

The U.S. Government has a paid-up license in this invention and the right in limited circumstances to require the patent owner to license others on reasonable terms as provided for by the terms of Contract No. N00014-96-C-2081 awarded by Naval Research Laboratory.

BACKGROUND OF THE INVENTION

1. Field of the Invention

This invention relates to the field of devices for mechanically tuning thin-film resonators. More particularly, it relates to slidable tuning elements suitable for use in filters maintained at cryogenic temperatures.

2. Description of Related Art

Recently, the field of thin-film, high-Q resonators for microwave applications has advanced rapidly. This advance has been particularly notable in the area of superconductive filters, particularly those designed for communications systems operating at frequencies near 850 MHz (cellular) or 2 GHz (PCS). Typically, the filters are multiple-resonator microstrip line distributed or lumped element L/C circuits. Both bandpass and band stop filters have been described. Examples of these filters may be found, for example, in Zhang, et al., "Frequency Transformation Apparatus and Method in Narrow-band Filter Designs", U.S. Ser. No. 08/706,974; Hey-Shipton, et al. "High temperature superconductor lumped element band-reject filters", U.S. Pat. No. 5,616,539 and Hey-Shipton et al., "High temperature superconductor staggered resonator array bandpass filter", U.S. Pat. No. 5,616,538. Filters with as many as nineteen poles or resonators have been reported.

For satisfactory performance of multiple-resonator filters, each resonator must resonate at the same midband frequency $\omega_0$. While it is theoretically possible to design a filter in which the resonators each exhibit the same midband frequency, in practice manufactured filters, whether normal metal, dielectric or superconductive, do not necessarily have precisely the frequency response of the design, due to such things as variations in film characteristics, assembly variations and temperature effects. It is well known in the art to tune filters by positioning conductive or dielectric materials in the electromagnetic field above the filter element. For example, Matthaei, et al. "Microwave filters, Impedance-Matching Networks, and Coupling Structures" Artech House Books, MA, 1964 (reprinted 1980), pp. 168–173 discusses in detail the process of tuning a variety of types of bandpass filters.

Typically, designers utilize a screw-type tuning member. However, Superconductive thin-film filters present additional challenges. First, superconductors only exhibit a superconductive state below critical temperatures, which currently requires operating temperatures below about 77K. The filter must be tuned at this temperature and be capable of maintaining that tuning when brought to room temperature for shipping and then recooled for use. Second, for maximum performance these superconductors must be epitaxially deposited on a single crystal substrate. Practically, this limits the size of a filter to about 2–4 inches in any dimension. The filter designer will be faced with the task of positioning as many as 16 filter poles, each requiring tuning, within that limited space. This, in turn, requires densely packed tuning elements.

Prior art tuning mechanisms for thin-film superconductive rf resonators utilized a screw adjustment much like that used in larger, room temperature filters. The tip of the screw could be a conductive, magnetic or dielectric material. To avoid losses, and thus realize the high-Q advantage provided by the use of superconductive inductors, superconductive tuning tips are preferred over normal metal tips. Examples of such tuning methods are described in Higaki, et al., "Microwave Resonator of Compound Oxide Superconductor Material Having a Tuning Element With A Superconductive Tip", U.S. Pat. No. 5,391,543 and in Hey-Shipton et al., U.S. Pat. No. 5,616,538.

Screw-type tuning members, however, have several disadvantages when used in small, cryogenically cooled filter assemblies such as those required for thin-film superconductive filters. The tuning resolution is limited by the pitch of the screw threads. Axial stress tends to cause creep and stress relaxation which can alter critical positioning of the screw after tuning. The screws tend to wobble due to required thread clearances. The screws have large surface areas, leading to high radiative losses. They require relatively large spacing, limiting design choices for the filters. The required machining of the package and the use of multiple parts, make the package costly.

SUMMARY OF THE INVENTION

Accordingly, it is an object of the invention to provide a tuning mechanism for microwave filters that overcomes the limitations of the prior art screw tuning mechanisms.

It is a further object of the invention to provide a readily manufacturable method of assembling and adjusting the tuning mechanism.

It is yet another object of the invention to provide an actuator for adjusting the position of the tuning pin in situ.

It is also an object of the invention to provided a tuning pin mechanism which allows vacuum venting of the filter package.

These and other objects of the invention are met by providing a tuning mechanism comprising a spring pin having a superconductive, dielectric or magnetic tuning tip attached thereto. The spring pin is slidably inserted into a filter package wall through a mating hole. A mechanism is provided for adjusting the position of the tip within the electromagnetic field above the filter element. The tip may be shaped, thus allowing adjustment of both the height of the tip above the filter element and the position of the tip in a plane parallel to the plane of the filter. Optionally, the spring pin may include an offset to allow close spacing of the tips along with wider spacing of the actuator end of the pin.

BRIEF DESCRIPTION OF THE DRAWINGS

Referring to the drawings in which like reference numerals and letters indicate corresponding structure throughout the several views.

DETAILED DESCRIPTION OF THE INVENTION

Tuning Pin Structure

Figure 1:
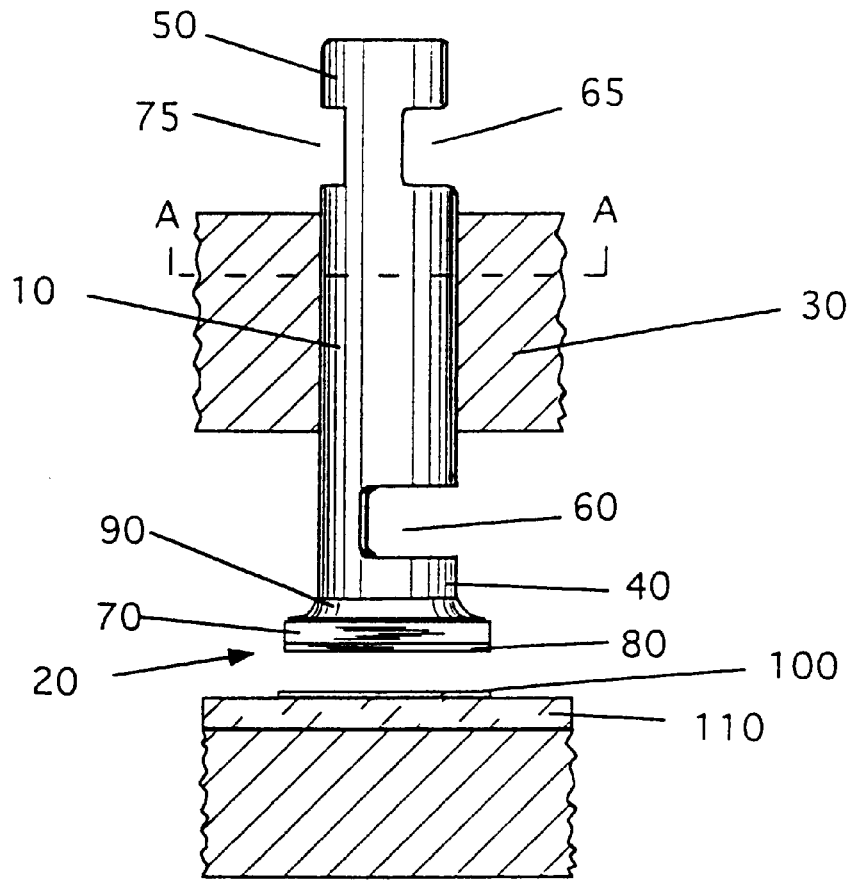
FIG. 1 illustrates a side view of one embodiment of the invention.
Figure 4:
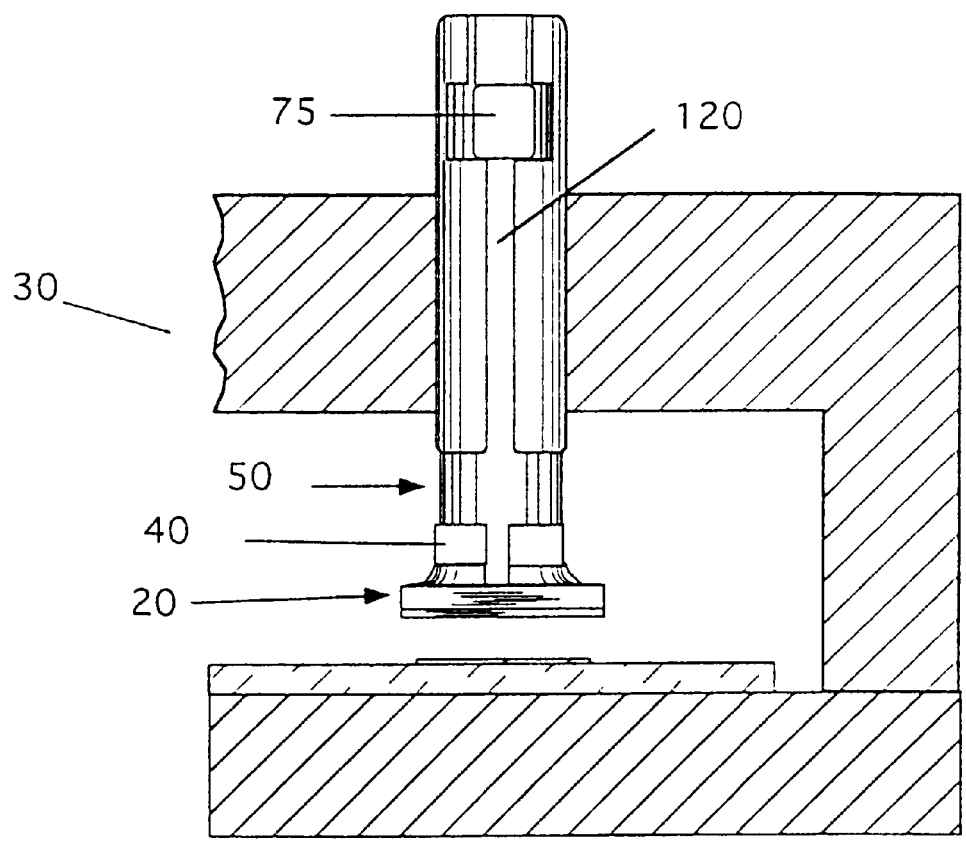
FIG. 4 illustrates a front view of the embodiment shown in FIG. 1.

FIGS. 1 and 4 illustrate a side view and a front view, respectively, of a first embodiment of the invention suitable for use in tuning inductive elements of superconductive filters. The tuning assembly comprises a spring pin 10, a tuning tip 20, and a tuning pin support 30. Typically, the support comprises the wall of the filter package with a mating hole therein for insertion of the tuning pin.

Figure 2:
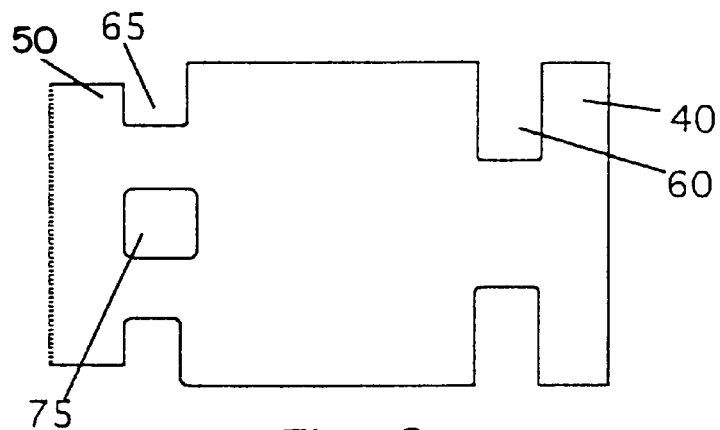
FIG. 2 illustrates a stamped pin blank from which the spring pin is formed.

FIG. 2 depicts the spring pin blank from which the spring pin of FIG. 1 is formed. In the preferred embodiment, the blank is approximately 0.4 inches long and 0.24 inches wide. The dimensions of the spring pin are not, however, critical to the invention, and any suitable dimensions may be used. One end of the blank is shaped to form an attachment end 40, while the other provides an actuator end 50. The spring pin blank is stamped from a resilient sheet metal strip made from a material such as BeCu, stainless steel or titanium. The spring pin is then formed into its desired shape in a fourslide or progressive die tool. Preferably, the spring pin material has high thermal conductivity. A gold or silver or other appropriate material coating may be plated on the pin to provide a solderable surface and to provide a lubricating effect for sliding the pin in the mating hole of the filter package.

Referring to FIGS. 1, 2, and 4, the attachment end 40 is configured for attachment of the tuning tip 20. The attachment end 40 is separated from the body of the spring pin by an undercut 60, which provides stress release and may also be used during insertion of the pin into the support. The actuator end 50 includes an undercut 65 (see FIGS. 1 and 2) and a cutout opening 75, configured for use with an actuating mechanism.

Referring again to FIGS. 1 and 4, the tuning tip 20 includes a substrate 70 (see FIG. 1) with a thin layer of a ceramic superconductor 80 (see FIG. 1) such as $YBa_2Cu_3O_7-\delta$ (YBCO) deposited epitaxially on its surface. The substrate may be any material that supports the growth of the superconductor, but is preferably a material having high thermal conductivity and low loss. Sapphire ($Al_2O_3$) or MgO are preferred. The tuning tip may be round, or may be of any convenient shape, such as square, oval or rectangular. This is in contrast to the prior art tuning screw, which must be round, as it rotates as it moves toward and away from the resonator.

The tuning tip is attached to the attachment end of the spring pin. In the preferred embodiment, a solderjoint 90 (see FIG. 1) attaches the substrate to the spring pin. The solder is preferably a low temperature solder to protect the YBCO from degradation due to exposure to high processing temperatures. Indium-Tin eutectic is preferred, due to its low melt temperature and low outgassing under vacuum. Other materials may be used, provided they do not degrade the superconductor and do not outgas. The attachment material need not be an electrically conductive material, but it is desirable that it be thermally conductive.

Figure 3:
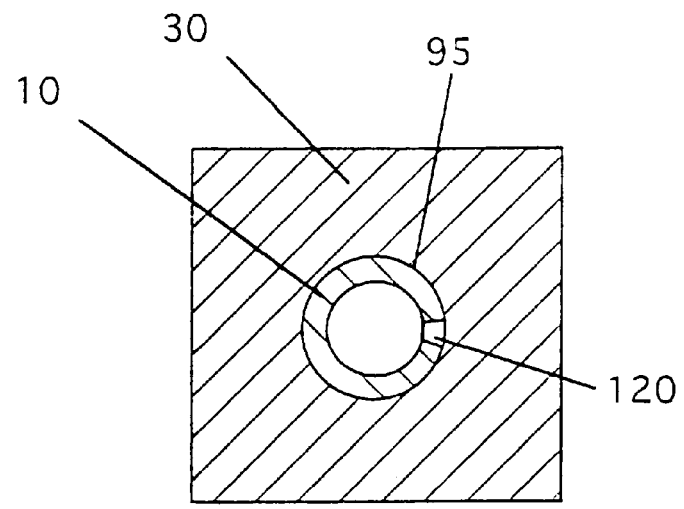
FIG. 3 illustrates a sectional view of the embodiment shown in FIG. 1 through section A—A.
Figure 9:
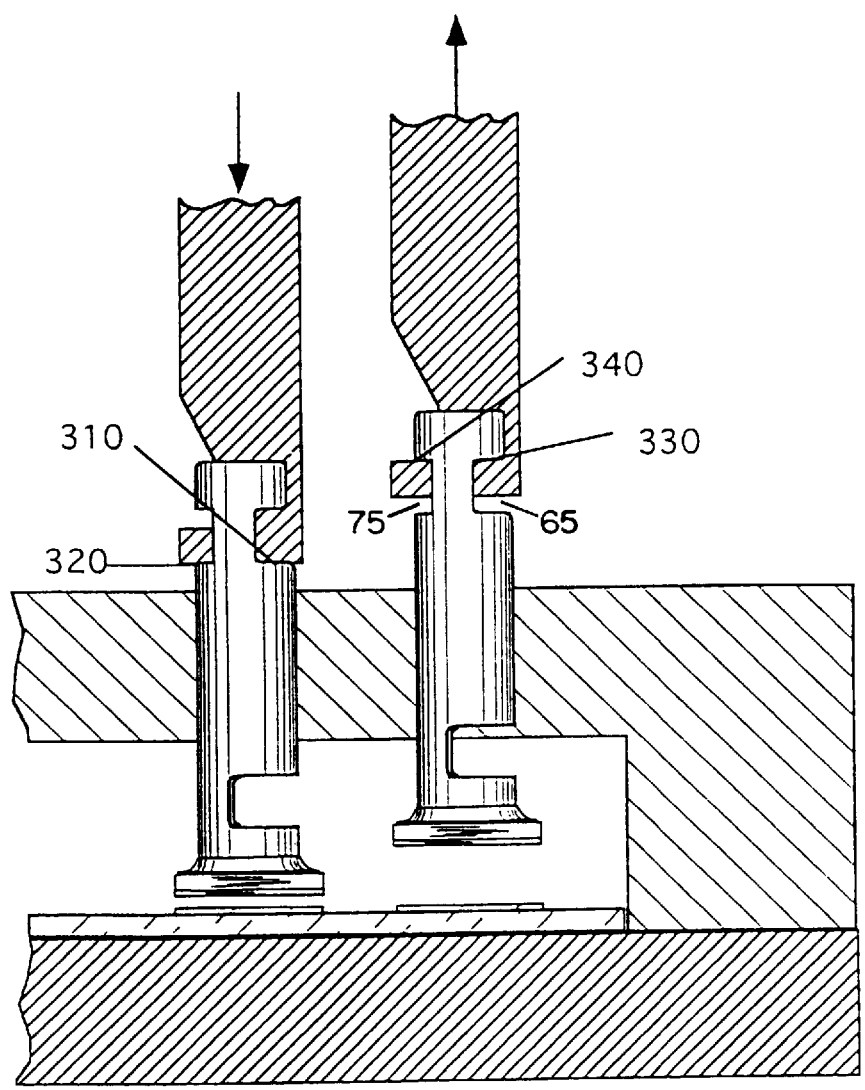
FIG. 9 illustrates pulling and pushing of the tuning pin of FIG. 1 by the actuator of FIG. 8.

The tuning pin assembly, comprising the spring pin 10 with attached tuning tip, is installed in the mating hole 95 in the filter package 30, as shown in FIG. 3, and is aligned with the tuning tip positioned above the filter element that is to be tuned; for example, above an inductive superconductive member 100 which is deposited on a filter substrate 110, as shown in FIG. 1. The hole 95 as depicted in FIG. 9 may be drilled, reamed or punched.

FIG. 3 is a top view of the tuning pin assembly positioned in the tuning pin support viewed through line A—A of FIG. 1. The spring pin 10 has a lengthwise split 120 which permits compression of the pin, as shown in FIGS. 3 and 4. In use, the resilient material of the pin is slightly compressed by the walls of the support.

FIG. 4 is a front view of the assembly of FIG. 1.

Method of Making The Tuning Pin

Figure 5A:
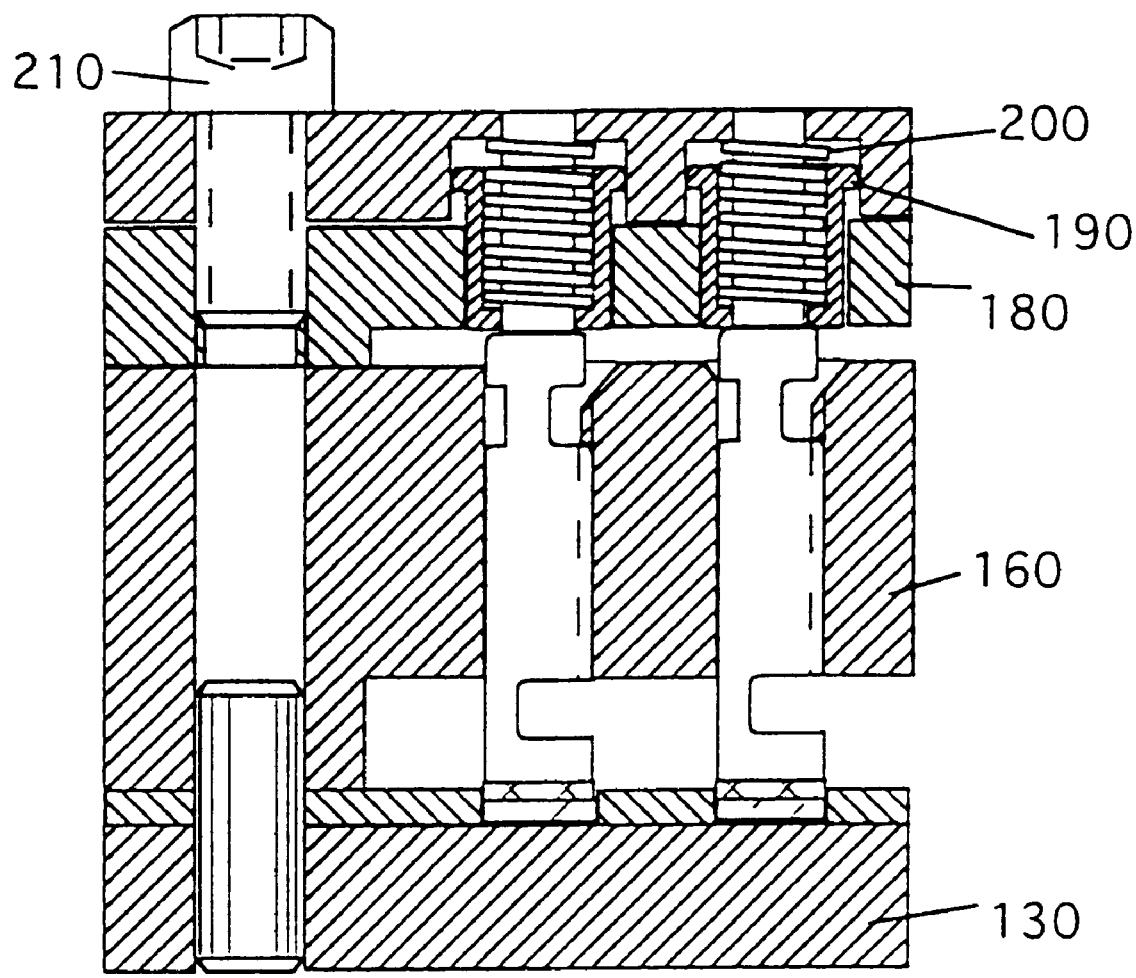
FIG. 5A illustrates a soldering fixture for assembling a tuning pin of the invention.
Figure 5B:
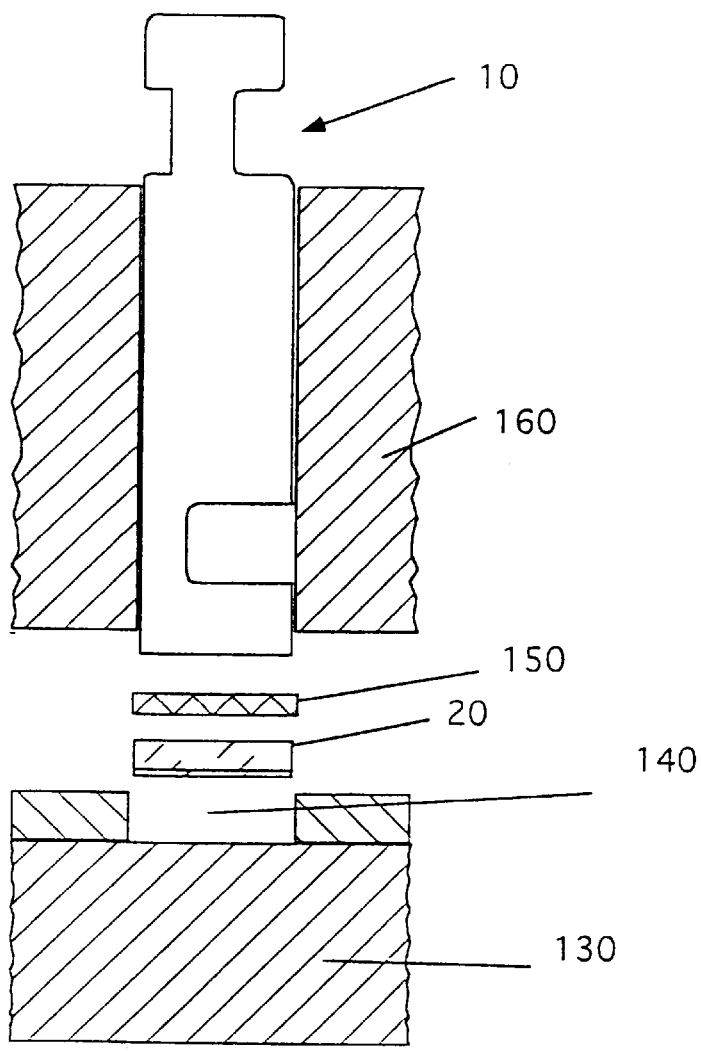
FIG. 5B illustrates the tuning pin and the middle and lower sections of the soldering fixture of FIG. 5A.
Figure 5C:
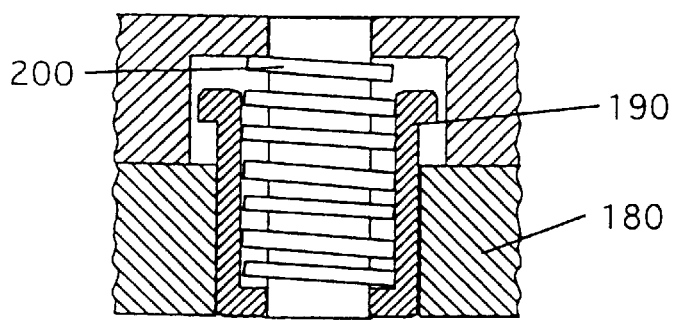
FIG. 5C illustrates a top section of the soldering fixture of FIG. 5A.
Figure 5D:
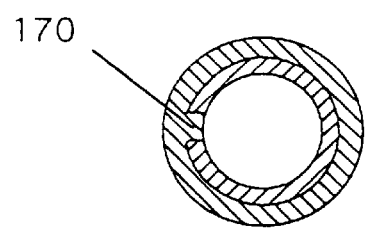
FIG. 5D illustrates a cross-section of the tuning pin in the soldering fixture of FIG. 5A.

The tuning pin is assembled preferably using a soldering fixture as shown in FIGS. 5A–5D. FIG. 5A illustrates the assembled fixture. FIGS. 5B–5D are 2× (two times) enlargements of parts of the fixture. The soldering fixture is conventional, and includes a base 130 with indentations 140 for receiving the tuning tip 20 and the solder preform 150, as shown in FIG. 5B. A middle section 160 is provided with holes for receiving the spring pin 10 as illustrated in FIG. 5B. A key 170 allows alignment of the spring pin, as shown in FIG. 5D. A top section 180 includes a pressure plate 190, with a spring 200, as illustrated in FIG. 5C for applying pressure to the assembly during reflow soldering. As illustrated in FIG. 5A, the pressure plate assembly is held together using screws 210 at each corner of the soldering fixture. To make the tuning pin, the tuning tip is first positioned in the indentation. If the tuning tip is a superconductor on a substrate, the tip is placed with the superconductor toward the base 130. Next, the solder preform is placed on the tuning tip. The spring pins are positioned in the middle section 160 using the key for alignment. The middle section is then placed on the base. Next, the top section 180, include the pressure plate 200 and the spring 190, is placed on the middle section. The soldering fixture is secured by uniformly tightening the screws. The entire soldering fixture is then heated to melt the solder, thereby securing the tuning tip to the spring pin. The heating may be accomplished by placing the entire soldering fixture in an oven.

A thermosetting adhesive may be used in place of the solder. Alternatively, a non-thermosetting adhesive may be used, in which case the heating step is eliminated.

Figure 6:
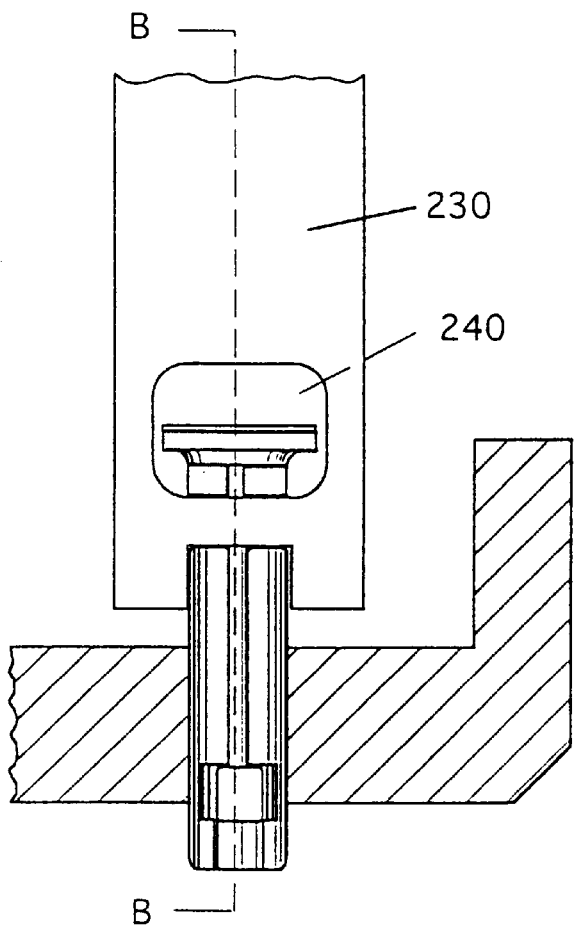
FIGS. 6 and 7 depict front and side views, respectively of a tuning pin with insertion tool for inserting the tuning pin in the tuning pin support.
Figure 7:
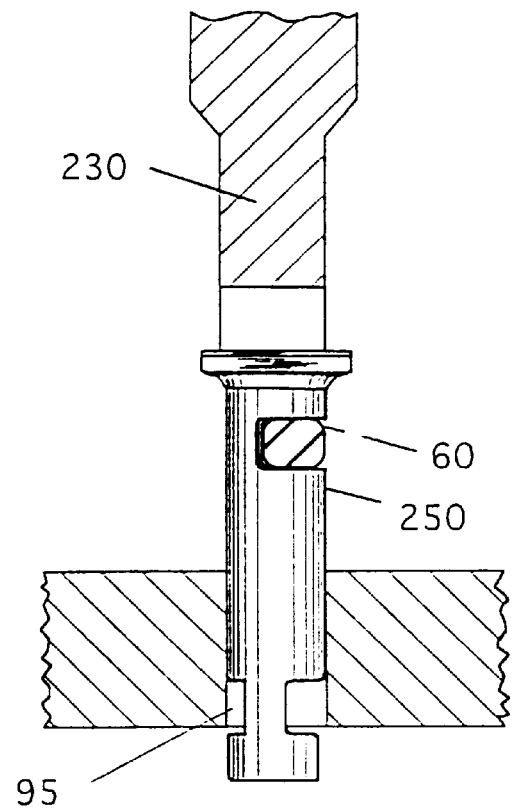

The assembled tuning pin may be installed in the pin support as shown in FIGS. 6 and 7. An insertion tool 230 having an opening 240 for receiving the tuning tip and a bar sized to rest against an edge 250 of undercut 60 is used to push the pin into the opening 95 in the support. The insertion tool may be manually operated, or may be installed in a mechanical press (not shown). Any other method of insertion of the pin is within the scope of the invention. Any method used should be capable of inserting the pin without damaging the tuning tip or excessively distorting the spring pin.

Tuning Pin Adjustment

The filter to be tuned may be a cavity, lumped element or distributed filter. It is preferably a superconductive filter. In the case of a superconductive, thin film filter, the superconductive conductors are preferably disposed on one side of a substrate, and a ground plane, which may also be of a superconductive material, is disposed on the opposite side of the substrate.

Figure 8:
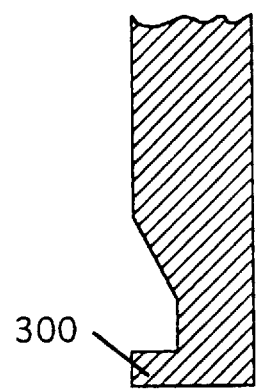
FIG. 8 illustrates an actuator for adjusting the position of the tuning pin.

After the tuning pin is inserted into the tuning pin support, the filter is tuned by adjustment of the position of the pin. An actuator mechanism is shown in FIG. 8. It comprises an engagement tip 300. In use, the engagement tip is inserted through cutout 65 and cutout opening 75. As shown in FIG. 9, the tuning pin can then be adjusted using a push-pull motion, with the engagement tip cooperating with the tuning pin actuation end at edges 310 and 320 of the undercut and cutout, respectively, on the push motion and 330 and 340, respectively, on the pull motion.

Figure 10:
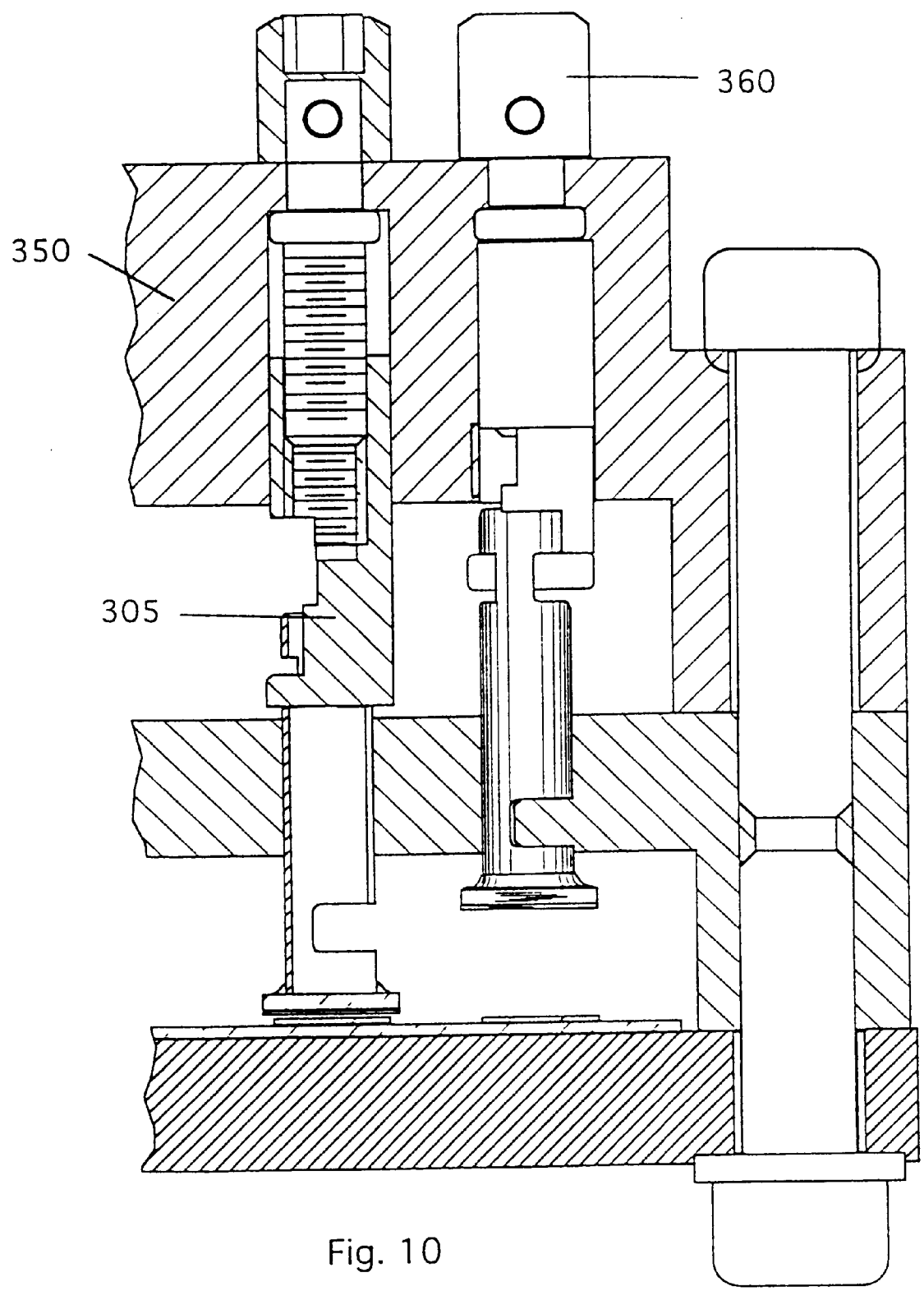
FIG. 10 illustrates an assembly for driving multiple actuators.

The actuator mechanism is preferably driven by an XYZ stage. An alternative, clamp-on actuator is shown in FIG. 10. The actuator includes a support 350 holding a plurality of identical adjustment heads. Each adjustment head includes a screw 360 which is inserted through an opening in the actuator support where it engages the threaded receptor 305. When the screw 360 is rotated clockwise, the tuning tip is raised. When it is rotated counterclockwise it is lowered.

For a superconductive filter, the filter assembly must first be cooled to its operational temperature, typically at or below 77K. This may be accomplished by placing the entire filter package in a bath of liquid nitrogen, in a vacuum space within a dewar or by placing it on a cold head of a mechanical refrigerator in a vacuum enclosure. Once the filter is at operational temperature, the filter is connected to an input signal and an output such as an oscilloscope. Each tuning pin is then separately adjusted to the desired resonant frequency by moving the pin toward or away from the resonator surface.

Conclusion

It will be appreciated by those skilled in the art that a number of variations are possible within the spirit and scope of the invention. For example, while the spring pin shown for illustrative purposes is essentially round, it does not need to be so. Oval or U-shaped spring pins are also within the scope of the invention. Similarly, the mating hole in the filter package need not be round. It need only be sized and shaped so as to afford a desired sliding force between the spring pin and the walls of the mating hole.

The tuning tip may be of any convenient shape and need not be centered on the spring pin. Indeed, it may be desirable to offset the tip where close spacing of resonators is needed. It may be convenient to add formed features to the spring pin for attachment of the tuning tip. These could be in the form of tabs extending either inward or outward form the centerline of the pin. It is not necessary to attach the tip directly to the pin. The tip could be attached to an insert that, in turn, is fitted into the spring pin, in which case, it can be used to achieve a desired offset.

While a superconductive tip is preferred for tuning superconductive elements of the resonator, it may be desired to use a dielectric tip, especially if the tip is to be positioned over a capacitive element of the resonator.

While the foregoing disclosure contains many specificities, it should be understood that these are given by way of example only. The scope of the invention should not be limited by the specific examples given above, but only by the appended claims and their legal equivalents.

What is claimed is:

1. A device for tuning a microwave resonator comprising:
   a tuning pin having an attachment end and an actuator end and comprising resilient material, said tuning pin being configured and arranged for compression when inserted through an opening in a pin support; and
   a tuning tip attached to said attachment end of said tuning pin;
   said tuning tip comprising a thin film of a superconductive material.

2. The device of claim 1 wherein said actuator end is configured for engagement of an actuator mechanism.

3. The device of claim 2, further comprising an undercut adjacent to said attachment end for providing stress relief in said attachment end.

4. The device of claim 1, wherein said tuning pin is split lengthwise along at least a portion of said tuning pin to facilitate compression of said tuning pin.

5. The device of claim 1 wherein said superconductive material is separated from said tuning pin by a dielectric substrate.

6. The device of claim 1, wherein said tuning tip is centered on said attachment end of said tuning pin.

7. A resonant circuit comprising:
   a first dielectric substrate;
   a patterned superconducting signal conductor provided on one surface of the substrate and a ground conductor provided on an opposite surface of said substrate; and
   a tuning pin comprising resilient material and configured and arranged for compression when inserted through an opening in a pin support, said tuning pin having a tuning tip attached thereto, said tuning tip being adjustably positioned to be able to penetrate into an electromagnetic field created when an electrical signal is applied to and propagated through said superconducting signal conductor, wherein a resonating frequency $f_0$ of said resonant circuit is adjustable by controlling a distance between said tuning tip and said patterned superconducting signal conductor.

8. The resonant circuit of claim 7, wherein said tuning tip comprises a dielectric material.

9. The resonant circuit of claim 7, wherein said tuning pin is split lengthwise along at least a portion of said tuning pin to facilitate compression of said tuning pin.

10. The resonant circuit of claim 7, further comprising the pin support having a housing with a mating hole, said tuning pin penetrating through and compressed within said mating hole so that said tuning pin is slidably adjustable.

11. The resonant circuit of claim 7, wherein the tuning pin further comprises an actuator end and the resonant circuit further comprises an actuator for coupling to said actuator end to adjustably position said tuning tip.

12. The resonant circuit of claim 7, wherein said tuning tip comprises a superconducting material.

13. A tuning assembly for a microwave resonator comprising:
   a tuning pin having an attachment end and an actuator end and comprising resilient material;
   a tuning tip attached to said attachment end of said tuning pin and comprising a thin film of a superconductive material; and
   a tuning pin support; said tuning pin support comprising a housing for enclosing the microwave resonator, said housing having a mating hole therein, said tuning pin penetrating through and compressed within said hole whereby said tuning pin is slidably adjustable within an electromagnetic field near said microwave resonator.

14. The tuning assembly of claim 13, wherein said tuning pin is split lengthwise along at least a portion of said tuning pin to facilitate compression of said tuning pin.

15. The tuning assembly of claim 13, further comprising an actuator for coupling to said actuator end and slidably adjusting said tuning pin.

16. A method of tuning a microwave resonator, comprising:

adjusting a distance between a superconducting signal conductor provided on one surface of a substrate and a slidably adjustable tuning tip provided on a tuning pin that penetrates through and is compressed within a mating hole of a tuning pin support.

17. The method of claim 16, wherein said tuning pin is split lengthwise along at least a portion of said tuning pin to facilitate compression of said tuning pin.

18. The method of claim 16, wherein said tuning pin comprises an actuator end and an attachment end with said tuning tip provided on said attachment end.

19. The method of claim 18, wherein adjusting a distance between said superconducting signal conductor and said tuning tip comprises coupling an actuator to said actuator end of said tuning pin and slidably adjusting said tuning pin within said mating hole of said tuning pin support.

20. The method of claim 16, wherein said tuning tip comprises a thin film of superconductive material.

\* \* \* \* \*

UNITED STATES PATENT AND TRADEMARK OFFICE
CERTIFICATE OF CORRECTION

PATENT NO. : 5,968,876
DATED : OCTOBER 19, 1999
INVENTOR(S) : SOCHOR

It is certified that error appears in the above-identified patent and that said Letters Patent is hereby corrected as shown below:

Col. 4, line 45: "include" should read --including--

Col. 5, line 10: after "opening 75", please add --as depicted in FIG. 9--

Signed and Sealed this

Twenty-ninth Day of May, 2001

Attest:

NICHOLAS P. GODICI

*Attesting Officer*        *Acting Director of the United States Patent and Trademark Office*